US008878631B2

(12) United States Patent
Tong et al.

(10) Patent No.: US 8,878,631 B2
(45) Date of Patent: Nov. 4, 2014

(54) ACTIVE LOW PASS FILTER

(75) Inventors: Dominique Lo Hine Tong, Rennes (FR); François Baron, Thorigne Fouillard (FR); Raafat Lababidi, Rennes (FR); Ali Louzir, Rennes (FR)

(73) Assignee: Thomas Licensing, Boulogne-Billancourt (FR)

( * ) Notice: Subject to any disclaimer, the term of this patent is extended or adjusted under 35 U.S.C. 154(b) by 1109 days.

(21) Appl. No.: 12/312,501

(22) PCT Filed: Nov. 15, 2007

(86) PCT No.: PCT/EP2007/062393
§ 371 (c)(1),
(2), (4) Date: May 13, 2009

(87) PCT Pub. No.: WO2008/065009
PCT Pub. Date: Jun. 5, 2008

(65) Prior Publication Data
US 2011/0050363 A1    Mar. 3, 2011

(30) Foreign Application Priority Data

Nov. 27, 2006  (FR) ..................................... 06 55109

(51) Int. Cl.
*H03H 7/03* (2006.01)
*H03H 11/04* (2006.01)
*H03H 7/01* (2006.01)
*H03H 11/52* (2006.01)

(52) U.S. Cl.
CPC ............ *H03H 7/0115* (2013.01); *H03H 11/52* (2013.01); *H03H 7/1758* (2013.01); *H03H 7/03* (2013.01)
USPC .......................................... 333/175; 333/213

(58) Field of Classification Search
CPC ... H03H 7/0115; H03H 7/075; H03H 7/1758; H03H 11/52
USPC .................................. 333/175, 168, 213, 216
See application file for complete search history.

(56) References Cited

U.S. PATENT DOCUMENTS

| | | | | |
|---|---|---|---|---|
| 6,944,435 | B2 * | 9/2005 | Contopanagos et al. ...... | 455/307 |
| 7,859,364 | B2 * | 12/2010 | Sakisaka et al. .............. | 333/185 |
| 7,982,557 | B2 * | 7/2011 | Sakisaka et al. .............. | 333/185 |

FOREIGN PATENT DOCUMENTS

| | | |
|---|---|---|
| JP | 52123151 | 10/1977 |
| JP | 56104232 | 8/1981 |
| JP | 59183521 | 10/1984 |
| JP | 61107832 | 5/1986 |
| JP | 2149120 | 6/1990 |

OTHER PUBLICATIONS

Tong et al., "Low-pass active filter enabling DVB-H/T and GSM standard coexistenc", 2007, IEEE, p. 1047-1050.*
S. Dardillac et al: "Highly selective planar filter using negative resistances for loss compensation" Microwave Conference, 2003, 33$^{RD}$ European Oct. 7-9, 2003, IEEE, vol. 2, Oct. 7, 2003, pp. 821-824, XP010681021.

(Continued)

Primary Examiner — Dean O Takaoka
Assistant Examiner — Alan Wong
(74) Attorney, Agent, or Firm — Tutunjian & Bitetto, P.C.

(57) ABSTRACT

The invention relates to a selective active low-pass filter and to a method for improving the selectivity of such a filter. The method includes centering, in the center of a network, the resonant element whose frequency is closest to the cutoff frequency of the filter and in inserting in series with this element a negative resistance of higher value than the parasitic resistance of the filter.

4 Claims, 3 Drawing Sheets

(56) References Cited

OTHER PUBLICATIONS

William B. Kuhn et al: "A 200 MHz CMOS-Enhanced LC Bandpass Filter", IEEE Journal of Solid-State Circuits, IEEE Service Center, US, vol. 31, No. 8, Aug. 1996, XP011060293.

K-K M Kwok-Keung M Chen et al: "Noise Performance of Negative-Resistance Compensated Microwave Bandpass Filters-Theory and Experiments" IEEE Transactions on Microwave Theory and Techniques, IEEE Service Center, vol. 49, No. 5, May 2001, XP011038319.

Search Report Dated Feb. 28, 2008.

* cited by examiner

ACTIVE LOW PASS FILTER

RELATED APPLICATION INFORMATION

This application claims the benefit, under 35 U.S.C. §365 of International Application PCT/EP2007/062393, filed Nov. 15, 2007, which was published in accordance with PCT Article 21(2) on Jun. 5, 2008 in English and which claims the benefit of French patent application No. 0655109, filed on Nov. 27, 2006.

BACKGROUND

The invention relates to a selective active low-pass filter and to a method for improving the selectivity of an active low-pass filter. It comes under the framework of the Multi-Radio-Front-End (MRFE) project for the design of multi-mode, multi-standard, fixed/mobile terminals integrating for example cellular telephone (GSM, UMTS etc.) systems, terrestrial digital television receiver (DVB-H/T) systems and systems for accessing local networks (WLAN a/b/g).

From a technical point of view, this convergence of various access modes into a single communicating object involves problems of coexistence due, in particular, to the proximity of the operating frequency bands of each of the modes.

The present invention is concerned, more particularly, with the coexistence of the DVB-H/T and GSM standards for which, as shown in FIG. 1, it is clear that the GSM signals transmitted within the band 890-915 MHz are definitely going to interfere with and degrade the DVB-T/H reception if no filtering device is incorporated into the system for isolating the 2 bands.

The very severe specification in terms of width leads necessarily to the use of an ultra-selective low-pass filter. Indeed, this filter must have a cut-off frequency higher than or equal to 862 MHz and reject the GSM band, from 890 to 915 MHz, by at least 20 dB. According to the results of a preliminary analysis, only the use of a filter of order 11 and possessing a response of the pseudo-elliptical type allows these objectives to be attained.

The network for this filter is shown in FIG. 1. The synthesis of this filter automatically leads to a symmetrical network structure. This comprises:
  6 coupling inductors: 2*L1, 2*L2, 2*L3 connected in series between the input terminal E and the output terminal S;
  and 5 series LC resonant elements: 2*Lr1/Cr1, 2*Lr2/Cr2, 1*Lr3/Cr3, inserted between the various coupling inductors and ground. These series LC elements resonate at frequencies that are very close to the cut-off frequency of the filter, and thus create transmission zeros which will allow the selectivity of the filter to be drastically enhanced.

An application of the method of synthesis of this network recommended for this width of filter leads to the following values for the components:
  Coupling inductors: L1=1.5 nH, L2=10 nH, L3=9.1 nH
  Series L/C elements: Lr1=11 nH, Lr2=7.5 nH, Lr3=6.8 nH
    Cr1=2.2 pF, Cr2=3 pF, Cr3=3.3 pF An important remark for the following section relates to the resonance frequency of the L/C elements: It can indeed be noted that the L/C resonators which allow the transmission zeros to be obtained that are closest to the cut-off frequency are situated at the ends of the network, here in this case the 2 Lr1/Cr1 that resonate at the frequency Fr1=1023 MHz. The 2 other L/C resonators resonate at the frequencies Fr2=1061 MHz and Fr3=1062 MHz.

FIG. 2 shows the transmission response simulated by considering ideal L/C components. In this case, a cut-off frequency Fc around 860 MHz, shown by the point m1, and a rejection of the GSM band of greater than 40 dB, shown from the point m2, may effectively be noted.

The components usually employed are SMCs (for Surface-Mounted Components) such as offered, for example, by the manufacturer Murata from the series LQW15 for the inductors and from the series GRM15 for the capacitors.

In reality, if the parasitic elements are taken into account, the insertion losses are severely degraded in the neighbourhood of Fc. This degradation is mainly due to the parasitic series resistance (of typical value of around 1 ohm for wound SMC inductors) of the inductors which reduces the quality factor of the latter and consequently the performance of the filter in terms of insertion losses and selectivity. In FIG. 2, which shows the simulated performance of the filter taking into account the parasitic elements of the L/C components of the network, the degradation of the insertion losses at Fc is noted, said losses having risen to higher than 13 dB.

SUMMARY

The invention aims to overcome these drawbacks.

The invention consists of a method for improving the selectivity of a low-pass filter with a cut-off frequency $F_c$, formed by a symmetrical network of LC resonant elements associated with coupling inductors configured in series between the input and output ports.

The method for improving the selectivity comprises the following steps for:
  centring the element resonant at the frequency closest to the cut-off frequency $F_c$ in the centre of the network;
  inserting a negative resistance RN in series with this resonant element;
  optimizing the values of the components of the LC resonant elements of the network in order to match the filter within the band of operation.

The invention has the advantage of solving the problematic situation of coexistence of the DHV_H/T and GSM standards.

The invention also consists of a selective active low-pass filter with cut-off frequency Fc formed by a network of inductors L and of LC resonators. It comprises, in the centre of the network, a negative resistance RN in series with the element resonant at the frequency closest to the cut-off frequency Fc.

Preferably, the negative resistance has a value greater than the parasitic resistance of the coupling inductor.

According to one variant of the invention, the filter is of order 11 and exhibits a response of the pseudo-elliptical type.

This thus leads to the following advantages:
  Thanks to the use of only one negative resistance, the size of the filter is limited, its cost and power consumption are low and, thanks to an electrically stable function, the filter may be inserted, unconditionally, into a receiver system.

BRIEF DESCRIPTION OF DRAWINGS

The abovementioned features and advantages of the invention, together with others, will become more clearly apparent upon reading the following description, presented in conjunction with the appended drawings, in which.

DETAILED DESCRIPTION OF PREFERRED EMBODIMENTS

In order to simplify the description, the same references will be used in these latter figures to denote the elements fulfilling identical functions.

The most critical parasitic resistances are those of the inductors Lr which allow the transmission zeros to be created close to Fc, and, more particularly, Lr1 which, connected in series with Cr1, creates a transmission zero nearest to Fc as has been stated previously.

The design proposed here is based on the use of an active filtering technology allowing, thanks to a response of the pseudo-elliptical low-pass type, the transmitted unwanted GSM band to be rejected and the entire DVB band from 470 to 862 MHz to thus be protected from potential interference.

An active filter is defined as a filter comprising active components such as mainly transistors. It is clear that an active filter, with respect to a passive filter, allows higher performance in terms of insertion losses and selectivity to be attained, thanks to the compensation made possible for the losses inherent to passive elements. However, the active components in the filters lead to a certain number of problems such as the electrical stability, the device noise, the non-linearities of the active components and the electrical power consumption.

In the particular case of a low-pass network, the losses of the inductors are compensated by introducing an active circuit in series whose purpose will be to create a negative resistance which will then compensate the parasitic resistance of these inductors.

Figure 1:
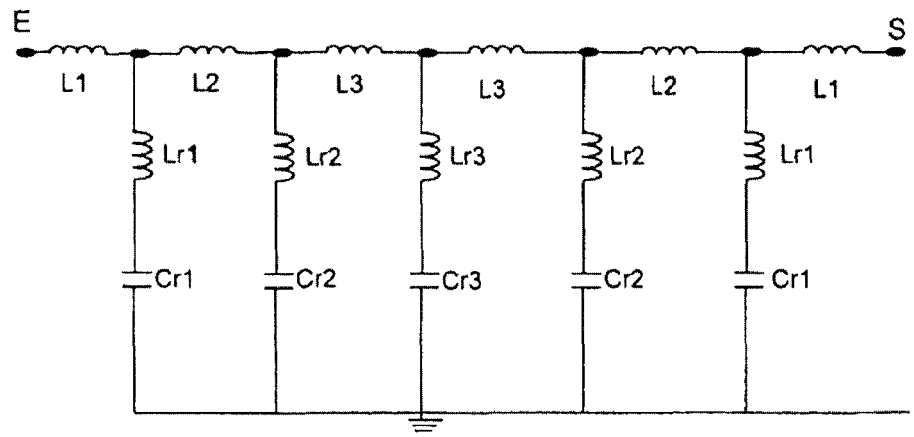
FIG. 1, already described above, shows a low-pass filter according to the prior art.
Figure 2:
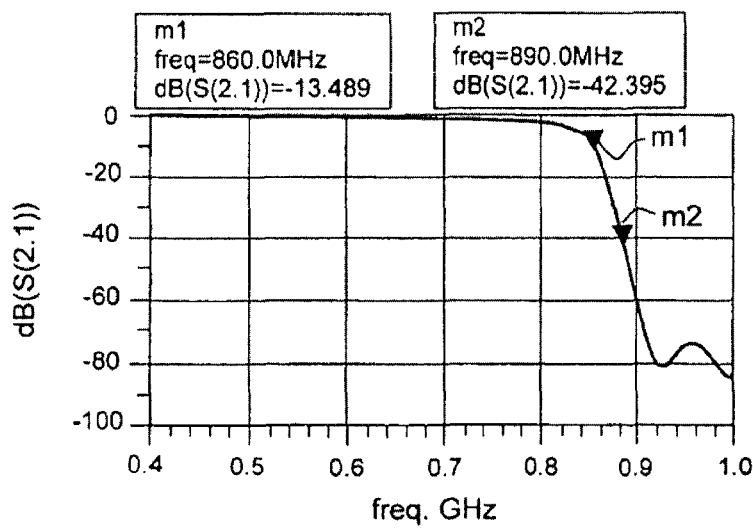
FIG. 2, already described above, corresponds to the simulated response curve of the low-pass filter taking into account the parasitic elements.
Figure 3:
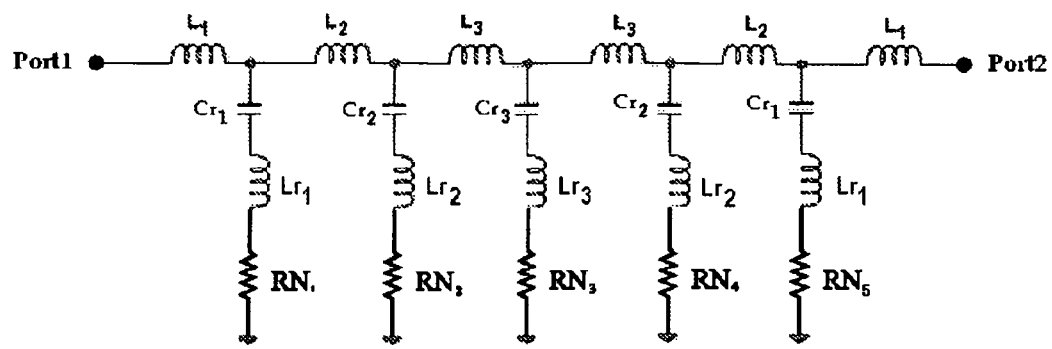
FIG. 3 shows a network of the active low-pass filter comprising negative resistances.

In the extreme case, in order to recover the performance of the ideal low-pass filter, a negative resistance would then have to be added to each of the L/C elements, in other words, for our 11 pole filter, it would be necessary to add a total of 5 resistances RN1, RN2, RN3, RN4 and RN5 as shown in FIG. 3. But the cost of the filter, its size and its power consumption would increase considerably.

Figure 4:
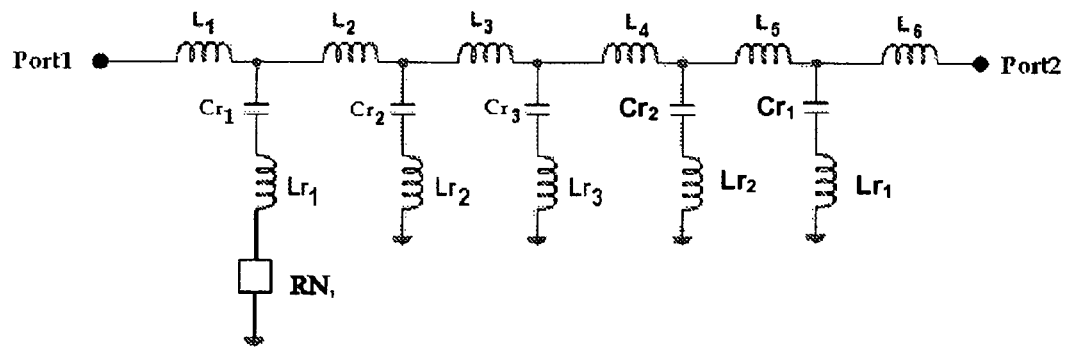
FIG. 4 shows a network of the active low-pass filter comprising a single negative resistance at one end of the network.

FIG. 4 illustrates another solution. It consists in only introducing a single negative resistance specifically placed in series with one of the 2 inductors Lr1 connected in series with the capacitor Cr1 and which allows the transmission zero closest to Fc to be created. Moreover, by taking a negative resistance RN1 of higher value than that of the parasitic resistance alone of the inductor, this resistance allows virtually all the losses of the network in the neighbourhood of the cut-off frequency Fc to be compensated.

For example, a negative resistance RN of value ~−7 ohms, conventionally designed using a structure with 1 bipolar transistor or with 2 bipolar transistors, allows a value of the parasitic resistance of ~1 ohm to be compensated.

Figure 7:
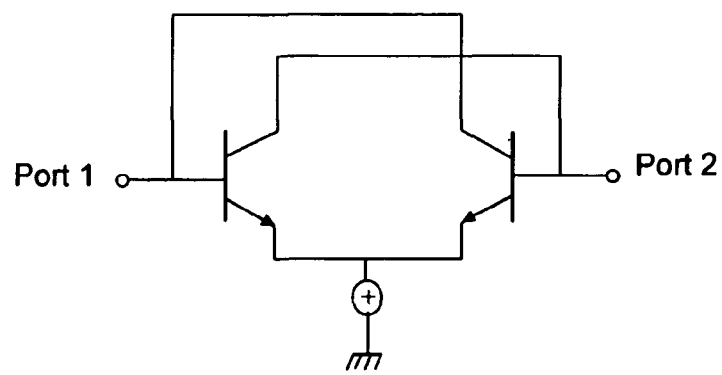
FIG. 7 shows a topology of a negative resistance.

FIG. 7 shows a topology of such a negative resistance. The ports 1 and 2 of the transistors are connected to the bases of the transistors. The collector of each of the transistors is connected to the base of the opposing transistor. A bias voltage is applied to the common point of the emitters. Many other circuits allow a negative resistance to be simulated.

The simulation results show that this filter is a potential source of electrical instability, in particular when the latter is inserted into the DVB-H/T receiver system.

By returning to the initial structure of the filtering network such as is usually employed, in particular the location of the LC resonators within this network, in other words by displacing one of the LC resonators situated at one end of the network and resonating at the frequency closest to the cut-off frequency Fc of the filter to the centre of the network, and by inserting a negative resistance in series with this LC resonator, the problem of instability is additionally overcome. The value of this resistance must necessarily by greater than the parasitic resistance of one inductor alone in order to compensate for the losses of the whole of the network and the values of the other L and C components of the network must again be optimized in order to re-match the filter within the band of operation.

Figure 5:
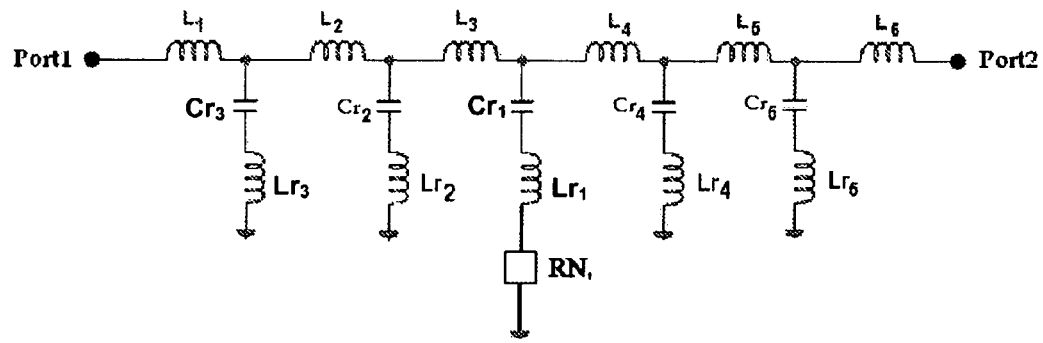
FIG. 5 shows a network of the active low-pass filter according to the invention comprising a single negative resistance in the centre of the network.

FIG. 5 illustrates such an active low-pass filter comprising a single negative resistance in the centre of the network. This active low-pass filter comprises 6 coupling inductors in series between the input port Port1 and the output port Port2. The 5 resonant elements are disposed such that one of the resonant elements Lr1/Cr1 resonating at the frequency closest to the cut-off frequency Fc of the filter is inserted in the centre of the filter. A negative resistance RN1 is inserted in series with this resonator Lr1/Cr1.

The 2 resonant elements Lr2/Cr2 are disposed on either side of the central element whereas the resonant elements Lr4/Cr4 and Lr3/Cr3 are connected at the ends of the filter.

The values of the resonant elements are then optimized in such a manner that the desired selectivity and matching performance is attained.

The addition of a single, judiciously placed, negative resistance allows the parasitic resistances of the most critical inductors to be compensated, and a modification of the initial filtering network such as is usually employed can make the filter unconditionally stable.

Figure 6:
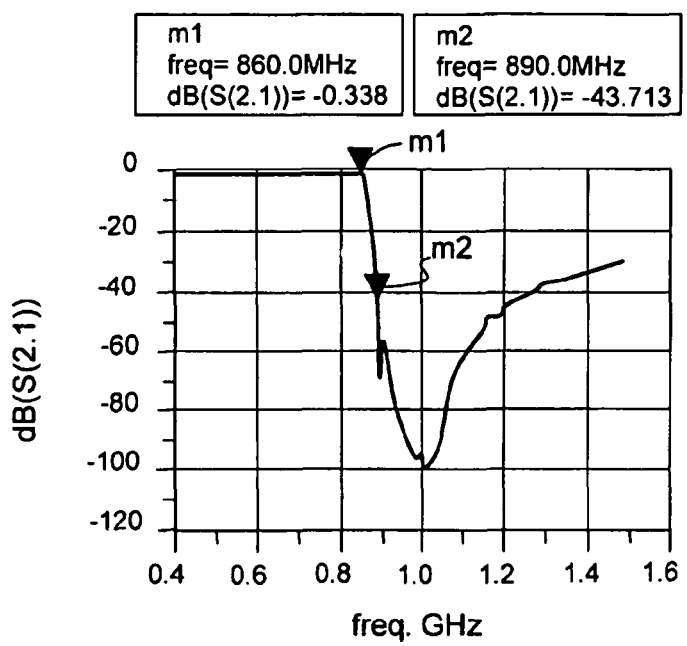
FIG. 6 shows the simulated response curve of the active low-pass filter according to the invention.

FIG. 6 shows the simulated response curve of the active low-pass filter according to the invention. It is seen that the attenuation of the unwanted GSM band reaches more than 40 dB. The point m2 of the curve corresponds to an attenuation of −43.71 dB at a frequency of 890 MHz. The point nil indicates a loss of −0.33 dB at a frequency of 860 MHz. The insertion losses thus remain very low.

The filtering device is completely electrically stable because, in addition, the simulated reflection parameters at the 2 ports of the filter are negative.

The filter obtained exhibits satisfactory performance both in terms of insertion losses within the DVB-H/T band and in terms of rejection of the unwanted GSM band. For this particular application where the operating frequency is relatively low (<1 GHz), the LC elements in question are discrete elements (or localized, of the SMC type) in order to conserve the compact nature of the filter, but it is clear that the concept is also applicable to other technologies, in particular when these LC elements are formed from distributed elements, for example transmission lines, for applications at higher frequencies.

The invention claimed is:

1. Method for improving the selectivity of a low-pass filter with a cut-off frequency, formed by a symmetric network comprising a plurality of coupling inductors and associated respective LC resonators, the LC resonators being inserted between the respective coupling inductors and ground, wherein the method comprises: the following steps:

centering a first LC resonator of the plurality of LC resonators in a center of the symmetric network with respect to the other LC resonators of the plurality of LC resonators, said first LC resonator resonating at a frequency which, compared to the resonant frequencies of the other LC resonators, is closest to the cut-off frequency;

inserting one negative resistance in series with the first LC resonator such that the low pass filter comprises a single negative resistance, and optimizing the values of the components of the LC resonators of the symmetrical network in order to match the low-pass filter within the band of operation and in order to reject the unwanted band to the desired level.

2. Selective active low-pass filter with a cut-off frequency formed by a network consisting of coupling inductors and of LC resonators, the LC resonators being inserted between the respective coupling inductors and ground, wherein, a first LC resonator of the LC resonators, resonating at a frequency which compared to the resonant frequencies of the other LC resonators, is closest to the cutoff frequency, and is placed in the center of a symmetrical network with respect to the other LC resonators, one negative resistance is inserted in series with the first LC resonator, and the values of the LC resonators of the network are optimized in order to match the low-pass filter within the band of operation and in order to reject the unwanted band to the desired level.

3. Selective active low-pass filter according to claim 2, wherein the negative resistance is greater than a parasitic resistance of the inductor of the first LC resonator.

4. Selective active low-pass filter according to claim 3, wherein the filter is of order 11 and exhibits a response of the pseudo-elliptical type.

* * * * *